United States Patent
Wang et al.

(10) Patent No.: US 11,233,111 B2
(45) Date of Patent: Jan. 25, 2022

(54) ARRAY SUBSTRATE, MANUFACTURING METHOD OF ARRAY SUBSTRATE AND DISPLAY PANEL

(71) Applicant: BOE TECHNOLOGY GROUP CO., LTD., Beijing (CN)

(72) Inventors: Pinfan Wang, Beijing (CN); Ming Che Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 316 days.

(21) Appl. No.: 16/491,360

(22) PCT Filed: Feb. 19, 2019

(86) PCT No.: PCT/CN2019/075485
§ 371 (c)(1),
(2) Date: Sep. 5, 2019

(87) PCT Pub. No.: WO2019/237759
PCT Pub. Date: Dec. 19, 2019

(65) Prior Publication Data
US 2021/0335976 A1    Oct. 28, 2021

(30) Foreign Application Priority Data
Jun. 14, 2018   (CN) .................. 201810615940.X

(51) Int. Cl.
*H01L 27/32*    (2006.01)
*H01L 51/00*    (2006.01)
*H01L 51/56*    (2006.01)

(52) U.S. Cl.
CPC ...... *H01L 27/3276* (2013.01); *H01L 51/0097* (2013.01); *H01L 51/56* (2013.01); *H01L 2227/323* (2013.01)

(58) Field of Classification Search
CPC . H01L 27/3276; H01L 51/56; H01L 51/0097; H01L 2227/323
See application file for complete search history.

(56) References Cited

U.S. PATENT DOCUMENTS

| 7,557,367 B2 | 7/2009 | Rogers et al. |
| 7,651,945 B2 | 1/2010 | Takayama et al. |

(Continued)

FOREIGN PATENT DOCUMENTS

| CN | 104157233 A | 11/2014 |
| CN | 107067979 A | 8/2017 |

(Continued)

OTHER PUBLICATIONS

International Search Report of PCT/CN2019/075485 in Chinese, dated May 8, 2019, with English translation.

*Primary Examiner* — Dung A. Le
(74) *Attorney, Agent, or Firm* — Collard & Roe, P.C.

(57) ABSTRACT

An array substrate, a manufacturing method of an array substrate, and a display panel are provided. The array substrate includes: a deformable substrate, the deformable substrate including a first region and a second region, the first region being provided with a plurality of voids, the second region being a region of the deformable substrate not provided with the plurality of voids; an electronic element on the second region of the deformable substrate.

19 Claims, 9 Drawing Sheets

(56) References Cited

U.S. PATENT DOCUMENTS

| | | | |
|---|---|---|---|
| 9,450,125 B2 | 9/2016 | Lee | |
| 2004/0248349 A1* | 12/2004 | Renna | H01L 21/302 |
| | | | 438/197 |
| 2015/0263235 A1 | 9/2015 | Shin et al. | |
| 2015/0314561 A1 | 11/2015 | Kim et al. | |
| 2016/0254286 A1 | 9/2016 | Song et al. | |
| 2016/0320878 A1 | 11/2016 | Hong et al. | |
| 2017/0110531 A1 | 4/2017 | Ko et al. | |
| 2017/0194190 A1* | 7/2017 | Su | H01L 21/76232 |
| 2018/0090698 A1 | 3/2018 | Jeong et al. | |
| 2018/0166324 A1* | 6/2018 | Schaeffer | H01L 29/41741 |
| 2019/0189639 A1 | 6/2019 | Zuo et al. | |
| 2019/0229282 A1 | 7/2019 | Zhang et al. | |

FOREIGN PATENT DOCUMENTS

| | | |
|---|---|---|
| CN | 107689420 A | 2/2018 |
| CN | 107871762 A | 4/2018 |
| CN | 107968109 A | 4/2018 |
| CN | 107994036 A | 5/2018 |
| CN | 108831893 A | 11/2018 |

* cited by examiner forming a deformable substrate, the deformable substrate including a first region and a second region, the first region being provided with a plurality of voids, and the second region being a region of the deformable substrate not provided with the plurality of voids forming an electronic element on the second region of the deformable substrate

ARRAY SUBSTRATE, MANUFACTURING METHOD OF ARRAY SUBSTRATE AND DISPLAY PANEL

CROSS REFERENCE TO RELATED APPLICATIONS

This application is the National Stage of PCT/CN2019/075485 filed on Feb. 19, 2019, which claims priority under 35 U.S.C. § 119 of Chinese Application No. 201810615940.X filed on Jun. 14, 2018, the disclosure of which is incorporated by reference.

TECHNICAL FIELD

Embodiments of the present disclosure relate to an array substrate, a manufacturing method of an array substrate and a display panel.

BACKGROUND

An array substrate generally includes a base substrate and a plurality of electronic elements on the base substrate, such as thin film transistors (TFTs) and the like. These electronic elements are capable of controlling other devices (such as display devices for displaying) disposed on the array substrate.

SUMMARY

Some embodiments of the present disclosure provide an array substrate, which includes: a deformable substrate, the deformable substrate including a first region and a second region, the first region being provided with a plurality of voids, and the second region being a region of the deformable substrate not provided with the plurality of voids; an electronic element on the second region of the deformable substrate.

In some examples, the plurality of voids are separated from a surface of a side of the deformable substrate where the electronic element is formed.

In some examples, the array substrate further includes a flexible base substrate, the deformable substrate is located on the flexible base substrate, and a side of the deformable substrate not provided with the electronic element is in contact with the flexible base substrate.

In some example, the plurality of voids are cavities.

In some example, the plurality of voids are grooves, and the grooves are on a side of the deformable substrate opposite to the electronic element.

In some example, the deformable substrate is made of an organic material.

In some example, the array substrate further includes a wire, the wire is on the deformable substrate, and the wire is a curved wire.

In some example, the wire and the electronic element are on a same side of the deformable substrate, and the wire is at least partially located in the first region.

In some example, the plurality of voids are evenly distributed in the first region of the deformable substrate.

Some embodiments of the present disclosure provide a manufacturing method of an array substrate, which includes: forming a deformable substrate, the deformable substrate including a first region and a second region, the first region being provided with a plurality of voids, and the second region being a region of the deformable substrate not provided with the plurality of voids; forming an electronic element on the second region of the deformable substrate.

In some example, the plurality of voids are separated from a surface of a side of the deformable substrate where the electronic element is formed.

In some example, the method further includes: forming a wire, wherein the wire and the electronic element are on a same side of the deformable substrate, and the wire is at least partially located in the first region.

In some examples, forming the deformable substrate includes: forming the deformable substrate on a stage; after forming the electronic element on the second region of the deformable substrate, the method further includes: removing the deformable substrate provided with the electronic element from the stage.

In some examples, after removing the deformable substrate on which the electronic element is formed from the stage, the method further includes: disposing the deformable substrate provided with the electronic element on a flexible base substrate, a side of the deformable substrate not provided with the electronic element being in contact with the flexible base substrate.

In some example, the deformable substrate includes a deformable layer provided with the plurality of voids and a planarization layer on the deformable layer, and forming the deformable substrate on the stage includes: forming the deformable layer on the stage; forming the planarization layer on the stage provided with the deformable layer.

In some example, forming the deformable substrate on the stage includes: forming a predetermined pattern on the stage, the predetermined pattern comprising an opening region, the opening region being provided with a plurality of openings; coating a solution for forming film on the stage provided with the predetermined pattern to form a coating layer and filling structures flowing into the plurality of openings, the plurality of voids being present in the filling structures of the plurality of openings; curing the coating layer and the filling structures of the plurality of openings, the predetermined pattern together with the coating layer and the filling structures after curing forming the deformable substrate.

In some example, forming the deformable substrate on the stage includes: forming a predetermined pattern made of a first material on the stage, the predetermined pattern including an opening region, the opening region being provided with a plurality of openings; forming filling structures in the plurality of openings by using a second material, a boiling point of the second material being less than a melting point of the first material; forming a planarization layer made of a third material on the stage provided with the filling structures, the boiling point of the second material being less than a melting point of the third material; heating the stage provided with the planarization layer at a predetermined temperature to vaporize the filling structures, the predetermined temperature being greater than the boiling point of the second material, and less than the melting points of the first material and the third material.

In some example, the first region and the second region are predetermined before forming the plurality of voids of the deformable substrate, the second region is a region required for forming the electronic element, and the first region is a region other than the region required for forming the electronic element.

Some embodiments of the present disclosure provide a display panel, including the array substrate according to any one of the aforementioned embodiments.

In some example, the display panel is an organic light emitting diode display panel.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

In order to make the objects, technical solutions and advantages of the present disclosure apparent, the embodiments of the present disclosure will be further described in detail below with reference to the accompanying drawings.

Figure 1:
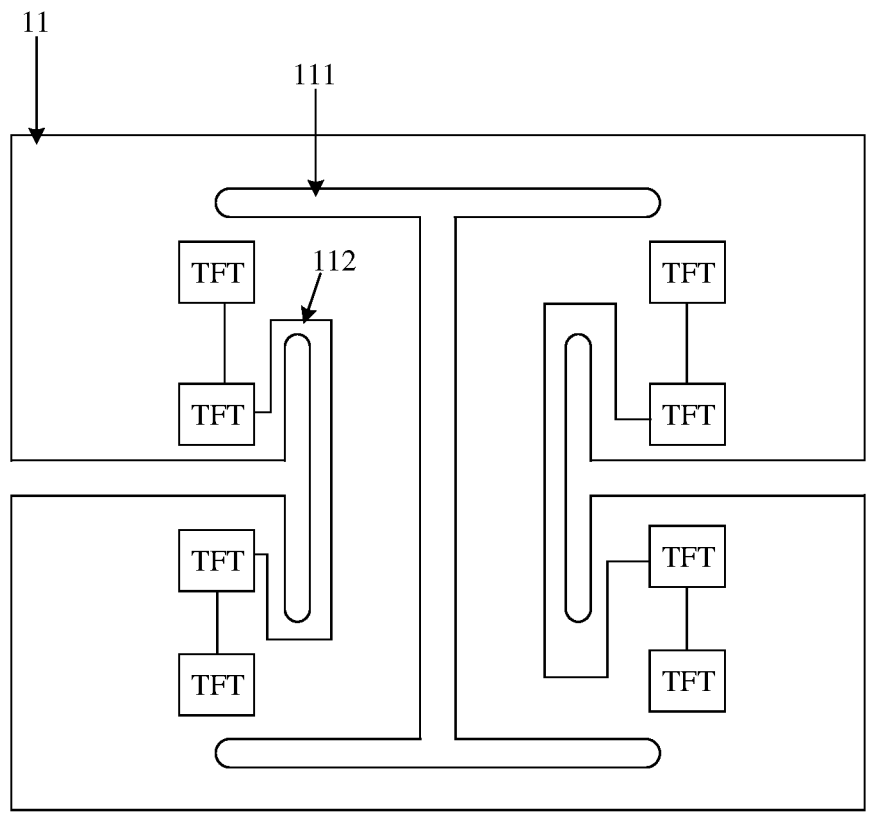
FIG. 1 is a schematic structural diagram of an array substrate in the related art.

An array substrate includes a base substrate provided with a plurality of strip-shaped through holes and a plurality of electronic elements on the base substrate. The plurality of strip-shaped through holes on the base substrate improve flexibility of the base substrate, so that the array substrate have flexible function to a certain degree. FIG. 1 is a schematic structural diagram of an array substrate. The array substrate includes a base substrate 11 provided with a plurality of strip-shaped through holes 111 and a plurality of TFTs on the base substrate 11. The plurality of strip-shaped through holes on the base substrate improve flexibility of the base substrate 11, so that the array substrate have flexible function to a certain degree.

The inventors of the present invention have found that the above-mentioned array substrate has at least the following problem: a region on the base substrate in which the strip-shaped through holes are provided cannot be provided with various devices including electronic elements and wires, resulting in that the array substrate can be provided with only a small number of devices. For example, the strip-shaped through holes 111 which are criss-crossed on the base substrate 11 severely limit the positions at which the TFTs and the various wires 112 are disposed. This makes the arrangement design of the TFTs and the wires 112 extremely difficult, and greatly limits the intensiveness of the arrangement of the TFTs, so that the array substrate is difficult to be applied to control a variety of devices that are intensive. Exemplarily, because the TFTs are difficult to control the intensively arranged devices in one-to-one correspondence, the array substrate is difficult to be applied to an organic light emitting diode (OLED) display panel in which the organic light-emitting devices are intensively arranged. Similarly, the array substrate is difficult to be applied to a liquid crystal display panel with intensively arranged sub-pixels.

The embodiments of the present disclosure provide an array substrate, a manufacturing method of an array substrate, and a display panel, which can solve the problems in the related art.

Figure 2:
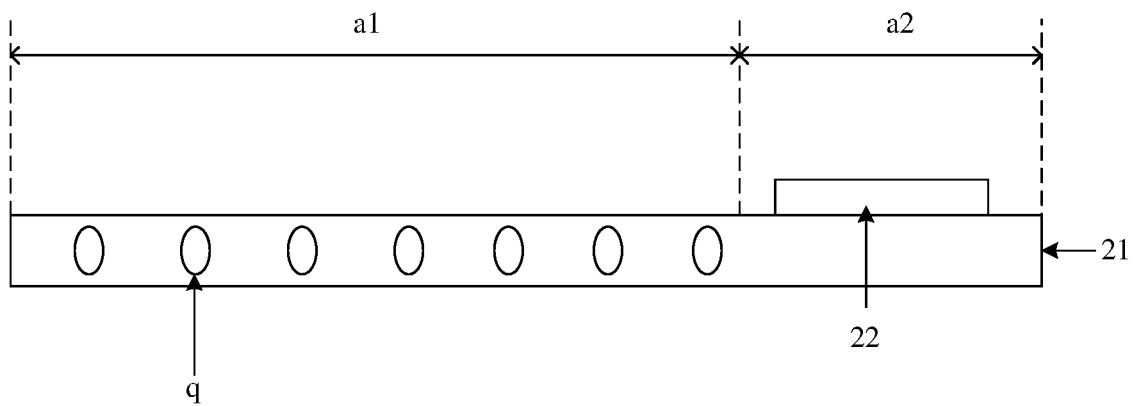
FIG. 2 is a schematic structural diagram of an array substrate according to an embodiment of the present disclosure.

FIG. 2 is a schematic structural diagram of an array substrate according to an embodiment of the present disclosure. The array substrate 20, for example, includes: a deformable substrate 21, the deformable substrate 21 includes a first region a1 and a second region a2, the first region a1 being provided with a plurality of voids q, and the second region a2 being a region of the deformable substrate 21 not provided with the plurality of voids q. The second region a2 of the deformable substrate 21 includes an electronic element 22.

The array substrate provided by the embodiments of the present disclosure, by disposing the thin film transistor on the deformable substrate having a plurality of voids, enable that the deformable substrate having the plurality of voids has a certain stretchable property and the normal arrangement of the thin film transistor and the wire are not affected. The problem that the array substrate can be provided with only a small number of devices, resulting from that the region on the base substrate in which the strip-shaped through holes are provided cannot be provided with various devices including electronic elements and wires, is solved in the related art. The effect that a large number of various devices can be disposed on the array substrate is achieved.

Figure 3:
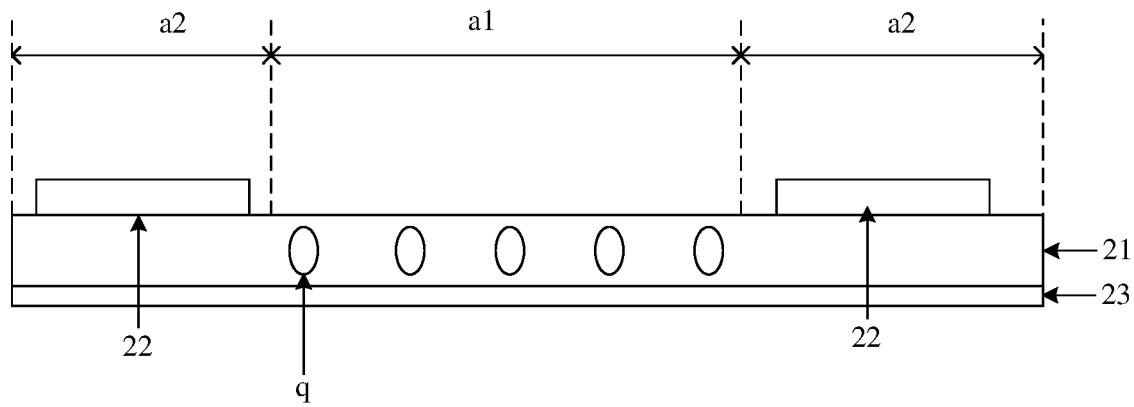
FIG. 3 is a schematic structural diagram of an array substrate according to another embodiment of the present disclosure.

Please referring to FIG. 3, FIG. 3 is a schematic structural diagram of an array substrate according to another embodiment of the present disclosure. The array substrate has some additional components on the basis of the array substrate illustrated in FIG. 2.

The array substrate 20 illustrated in FIG. 3 further includes a flexible base substrate 23. The deformable substrate 21 is disposed on the flexible base substrate 23, and a side of the deformable substrate 21 not provided with the electronic element 22 is in contact with the flexible base substrate 23. The flexible base substrate 23 can be made of a material having high flexibility. The electronic element 22 can include a thin film transistor or other electronic element disposed on the array substrate.

Optionally, as illustrated in FIG. 3, the plurality of voids q in the deformable substrate 21 are cavities. The cavities can be deformed when the deformable substrate 21 is deformed, to relieve internal stress of the deformable substrate 21 during deformation, so that the flexibility of the deformable substrate 21 is improved.

Optionally, the plurality of voids q are evenly distributed in the first region a1 of the deformable substrate 21. In this way, the flexibility of the array substrate 20 can be made uniform everywhere.

Besides, the plurality of voids q can be unevenly distributed in the first region a1 of the deformable substrate 21. Exemplarily, the first region can include a first sub-region provided with the voids and a second sub-region not provided with the voids, which is not limitative in the embodiments of the present disclosure.

In the embodiments of the present disclosure, the first region is a region in which the voids are distributed; whereas the second region is a region in which no void is provided. The electronic element can be disposed in the second region. The distribution of the second region and the first region on the deformable substrate can be determined by the region in which the electronic element is located. Optionally, a pre-designed region occupied by the electronic element can be set as the second region, and the other region can be set as the first region, and the voids are set in the first region. Exemplarily, the regions occupied by any two electronic elements on the deformable substrate can belong to the second region, and the region between the two electronic elements, in which no other electronic elements are disposed, can belong to the first region. That is, the first region can be a region other than the second region.

Figure 4:
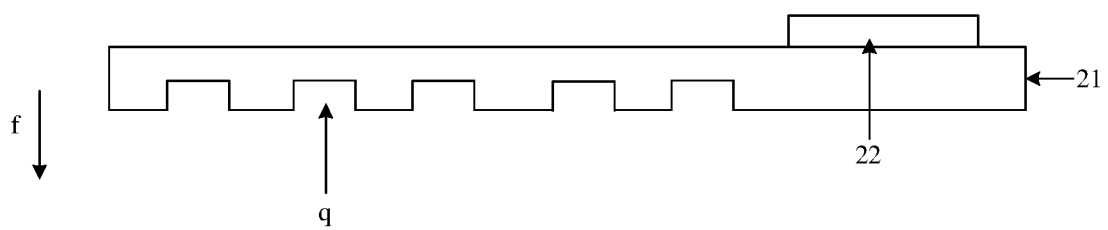
FIG. 4 is a schematic structural diagram of an array substrate according to another embodiment of the present disclosure.

Optionally, as illustrated in FIG. 4, FIG. 4 is a schematic structural diagram of an array substrate according to another embodiment of the present disclosure. The voids q in the deformable substrate 21 of the array substrate are grooves. Openings of the grooves are toward a direction f away from the electronic element 22. The grooves can also be deformed when the deformable substrate 21 is deformed, to relieve internal stress of the deformable substrate 21 during deformation, so that the flexibility of the deformable substrate 21 is improved.

Optionally, structures such as an inter-layer dielectric (ILD), a gate insulating layer, and a buffer layer, etc., can be further disposed between the electronic element 22 and the deformable substrate 21. These structures can be referred to related art, and details are not described herein again.

Figure 5:
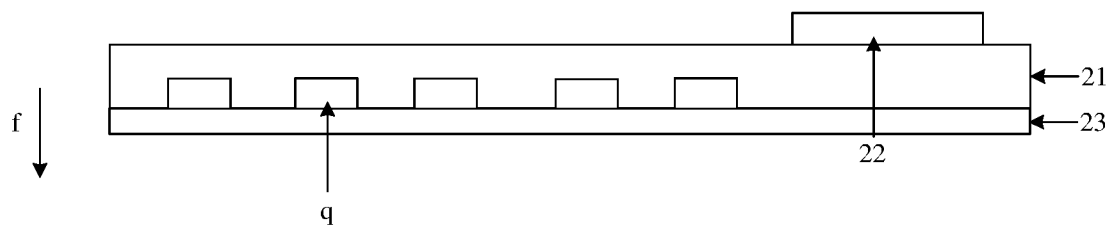
FIG. 5 is a schematic structural diagram of an array substrate according to another embodiment of the present disclosure.

Optionally, the array substrate illustrated in FIG. 4 can also be provided with a flexible base substrate, and a structure of the flexible base substrate can be as illustrated in FIG. 5. The flexible base substrate 23 can form cavities with the voids q. And the cavities can be deformed when the deformable substrate 21 is deformed, to relieve internal stress of the deformable substrate 21 during deformation, so that the flexibility of the deformable substrate 21 is improved.

Optionally, the deformable substrate 21 is made of an organic material. The organic material generally has a high flexibility.

Figure 6:
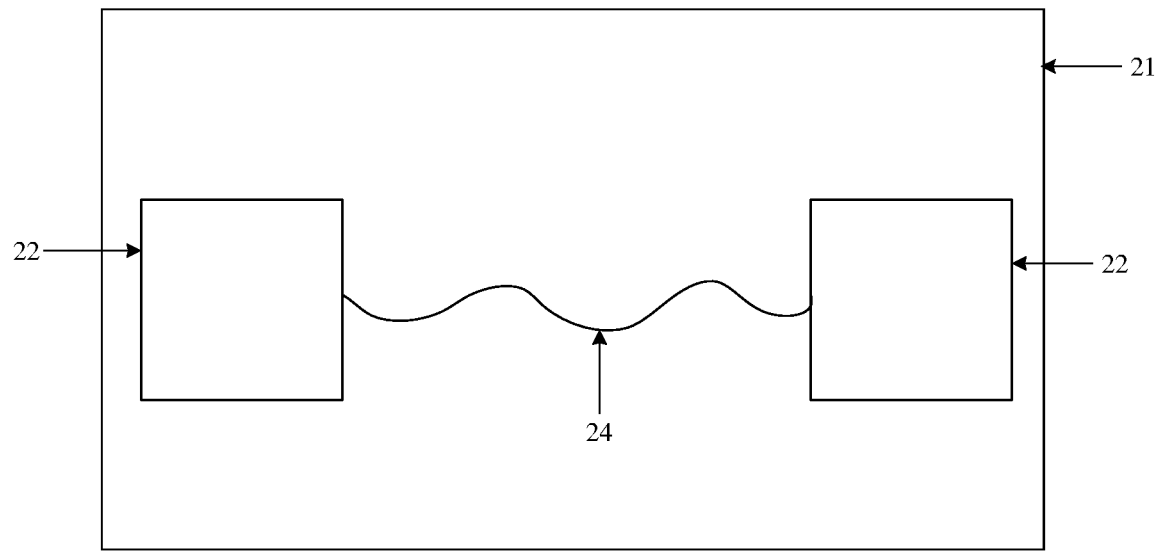
FIG. 6 is a plan view of the array substrate illustrated in FIG. 3.

Optionally, as illustrated in FIG. 6, FIG. 6 is a plan view of the array substrate illustrated in FIG. 3. The array substrate further includes a wire 24. The wire 24 is disposed on the deformable substrate 21, and the wire 24 is a curved wire. The wire 24 can be disposed in the first region of the deformable substrate 21 (not illustrated in FIG. 6), or can be disposed in the second region of the deformable substrate 21 (not illustrated in FIG. 6). When the deformable substrate 21 is stretched, the curved wires can be straightened with the deformable substrate, thereby avoiding the situations that the wire is broken, and improving the stretchability of the wire. A structure of the wire 24 connecting two electronic elements 22 is illustrated in FIG. 6. The structures of various wires on the array substrate provided by the embodiments of the present disclosure can be referred to the structure of the wire 24, and details are not described herein again. For example, the wire 24 can be at least partially disposed in the first region having the voids, thereby improving the flexibility of wire layout and increasing an effective area of the deformable substrate for disposing the electronic elements or the wires.

In addition, the voids (e.g., cavities or grooves) in the embodiments of the present disclosure are separated from a surface of a side of the deformable substrate where the electronic element or the wire is disposed. For example, the cavities are enclosed within the deformable substrate, while the grooves are disposed on a side of the deformable substrate opposite to the electronic element. For example, as illustrated in FIGS. 2 to 5, the voids are formed below the surface of the deformable substrate on which the electronic element is formed, without being in contact with the surface. Therefore, both the first region and the second region of the deformable substrate can be provided with the wire, so as to improve an area utilization of the deformable substrate.

The array substrate provided by the embodiments of the present disclosure, by disposing the electronic element on the deformable substrate having a plurality of voids, enable that the deformable substrate having the plurality of voids has a certain stretchable property and the normal arrangement of the thin film transistor and the wire are not affected. The problem that the array substrate can be provided with only a small number of devices, resulting from that the region on the base substrate in which the strip-shaped through holes are provided cannot be provided with various devices including electronic elements and wires, is solved in the related art. The effect that a large number of various devices can be disposed on the array substrate is achieved.

Figure 7:
FIG. 7 is a flowchart of a manufacturing method of an array substrate according to an embodiment of the present disclosure.

FIG. 7 is a flowchart of a manufacturing method of an array substrate according to an embodiment of the present disclosure. The method can be used to manufacture the array substrate provided in the embodiment illustrated in FIG. 2, and the method can include the following steps:

Step 701: forming a deformable substrate, the deformable substrate including a first region and a second region, the first region being provided with a plurality of voids, and the second region being a region of the deformable substrate not provided with the plurality of voids;

Step: 702: forming an electronic element on the second region of the deformable substrate.

The manufacturing method of the array substrate provided by the embodiments of the present disclosure, by forming the electronic element on the deformable substrate having a plurality of voids, enable that the deformable substrate having the plurality of voids has a certain stretchable property and the normal arrangement of the thin film transistor and the wire are not affected. The problem that the array substrate can be provided with only a small number of devices, resulting from that the region on the base substrate in which the strip-shaped through holes are provided cannot be provided with various devices including electronic elements and wires, is solved in the related art. The effect that a large number of various devices can be disposed on the array substrate is achieved.

The deformable substrate in the array substrate provided by the embodiments of the present disclosure can be formed in a variety of manners. According to different manners for forming the deformable substrate, the manufacturing methods of various array substrates are described below.

Figure 8:
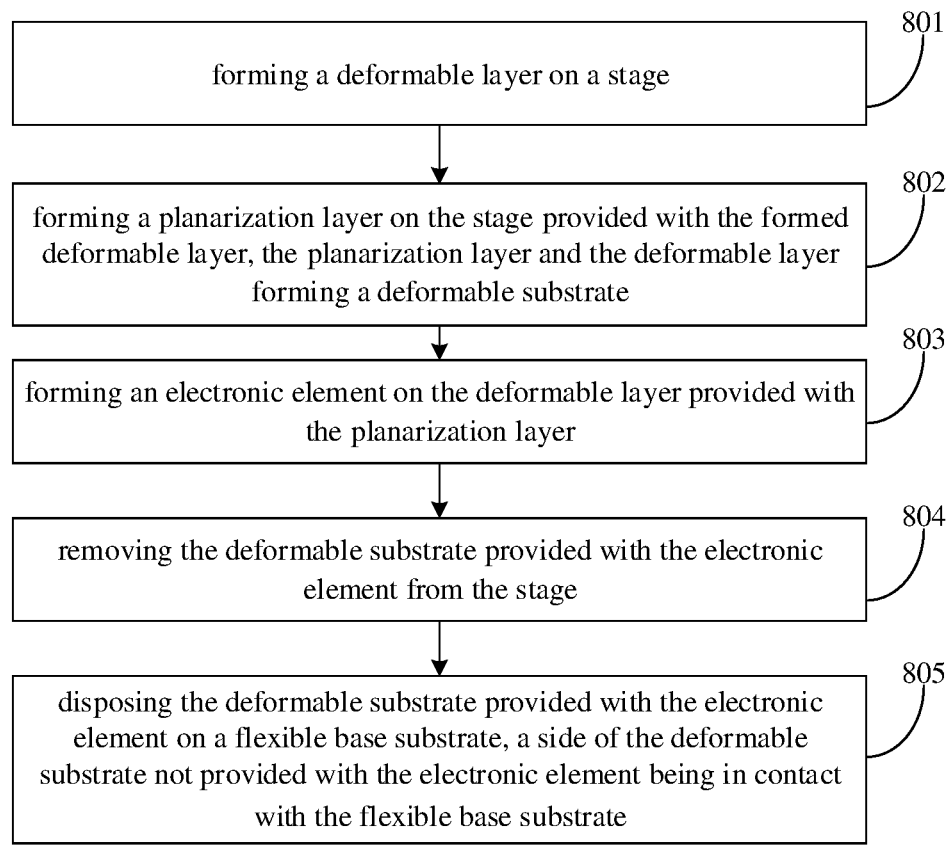
FIG. 8 is a flowchart of a manufacturing method of an array substrate according to another embodiment of the present disclosure.

FIG. 8 is a flowchart of a manufacturing method of an array substrate according to another embodiment of the present disclosure. The method can be used to manufacture the array substrate provided in the embodiment illustrated in FIG. 3, and the method can include the following steps:

Step 801: forming a deformable layer. For example, the deformable substrate can be formed on a stage.

When the method provided by the embodiment of the present disclosure is used, the deformable layer can first be formed on the stage in various manners. According to different structures of the deformable layer, the manners for forming the deformable layer can be different. Exemplarily, a layer to be processed can be formed on the stage, and then a plurality of grooves are formed on the layer to be processed by a patterning process to form the deformable layer. The stage can be a rigid stage for manufacturing a deformable substrate thereon. The deformable layer can be made of an organic material.

For example, the patterning process can include steps of coating a photoresist, exposing the photoresist, developing, etching, and removing the photoresist, and the like.

Figure 9:
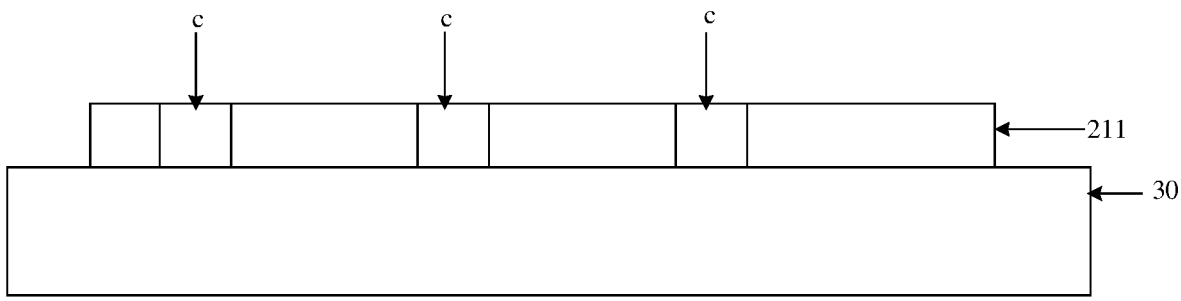
FIG. 9 is a schematic structural diagram of a deformable substrate on a stage in the embodiment illustrated in FIG. 8.

At the end of step 801, the structure of the deformable layer on the stage can be as illustrated in FIG. 9. And the stage 30 is provided with the deformable layer 211 formed with a plurality of grooves c.

Step 802: forming a planarization layer on the stage provided with the formed deformable layer, the planarization layer and the deformable layer forming a deformable substrate.

The planarization layer can be formed by a solution for forming film of high viscosity, to prevent a large amount of solution for forming the planarization layer from flowing into the grooves of the deformable layer.

The planarization layer can also be made of an organic material have high flexibility.

Figure 10:
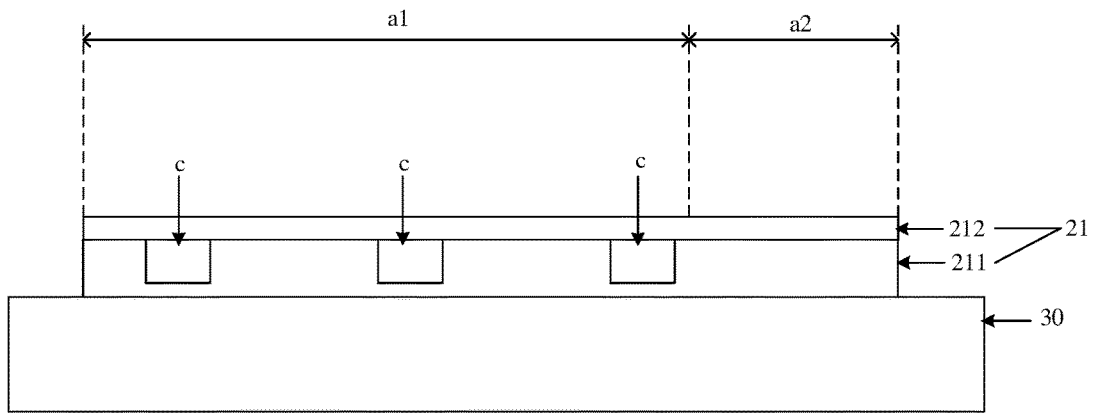
FIG. 10 is a schematic structural diagram of a deformable layer on a stage in the embodiment illustrated in FIG. 8.

At the end of step 802, the structure of the deformable substrate 21 on the stage can be as illustrated in FIG. 10. A region in which the orthographic projection of the region provided with the plurality of grooves c on the planarization layer 212 is located, can be the first region a1 of the deformable substrate 21, and a region other than the first region a1 can be the second region a2 of the deformable substrate 21.

Step 803: forming an electronic element on the deformable layer provided with the planarization layer.

The electronic element can be formed in the second region of the deformable substrate. The electronic element can include structures such as a gate electrode, an active layer, a source electrode and a drain electrode, and the like. And the electronic element may be formed in different manners depending on the types thereof (such as a top gate type TFT and a bottom gate type TFT). The manners for forming the electronic element can be referred to related art, and details are not described herein again.

Step 804: removing the deformable substrate provided with the formed electronic element from the stage.

Step 805: disposing the deformable substrate provided with the formed electronic element on a flexible base substrate, a side of the deformable substrate not provided with the electronic element being in contact with the flexible base substrate.

The flexible base substrate has certain protection and support for the deformable substrate and the electronic element. In addition, because the array substrate has a high requirement for flexibility of the flexible base substrate, the flexible base substrate is usually made of a material such as silicon and the like. For example, the material of the flexible base substrate can include polydimethylsiloxane (PDMS). However, such materials have a poor heat-resistant capability, resulting in that the flexible base substrate is difficult to withstand the temperature at which the electronic element (such as a TFT) is formed. Therefore, the embodiment of the present disclosure employs a manufacturing manner of, firstly forming the deformable substrate provided with the electronic element on the stage, and then disposing the deformable substrate on the flexible base substrate, so as to protect the flexible base substrate.

Figure 11:
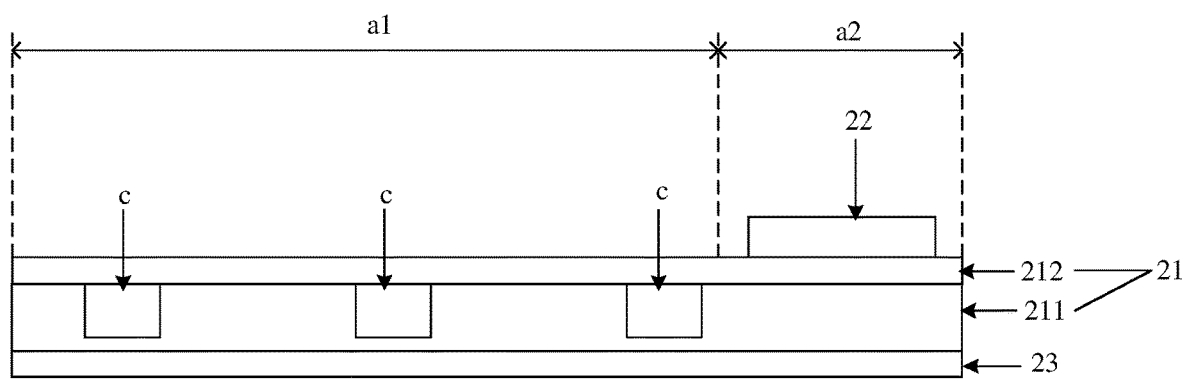
FIG. 11 is a schematic structural diagram of an array substrate in the embodiment illustrated in FIG. 8.

At the end of step 805, the structure of the array substrate can be as illustrated in FIG. 11. The deformable substrate 21 is disposed on the flexible base substrate 23, and the second region a2 of the deformable substrate 21 is provided with the electronic element 22.

The manufacturing method of the array substrate provided by the embodiments of the present disclosure, by forming the electronic element on the deformable substrate having a plurality of voids, enable that the deformable substrate having the plurality of voids has a certain stretchable property and the normal arrangement of the thin film transistor and the wire are not affected. The problem that the array substrate can be provided with only a small number of devices, resulting from that the region on the base substrate in which the strip-shaped through holes are provided cannot be provided with various devices including electronic elements and wires, is solved in the related art. The effect that a large number of various devices can be disposed on the array substrate is achieved.

Figure 12:
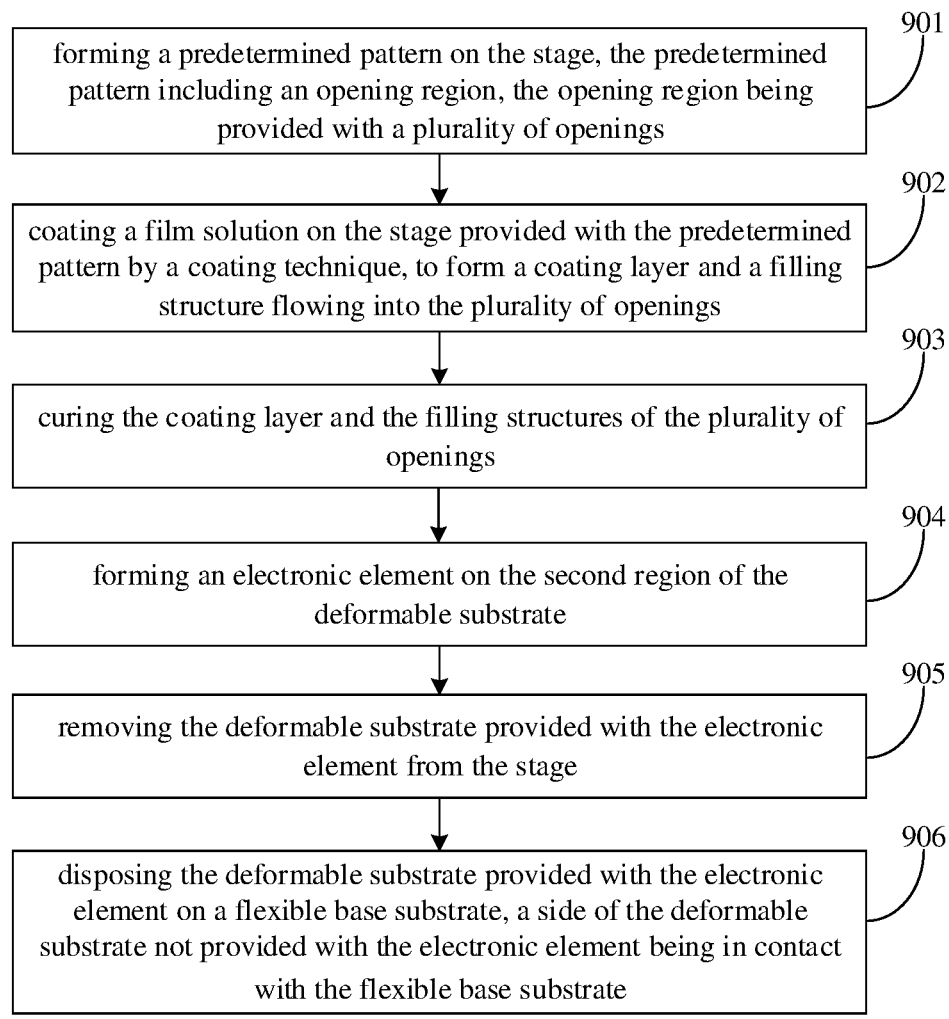
FIG. 12 is a flowchart of a manufacturing method of an array substrate according to another embodiment of the present disclosure.

FIG. 12 is a flowchart of a manufacturing method of an array substrate according to another embodiment of the present disclosure. The method can be used to manufacture the array substrate provided in the embodiment illustrated in FIG. 3, and the method can include the following steps:

Step 901: forming a predetermined pattern on the stage, the predetermined pattern including an opening region, the opening region being provided with a plurality of openings.

The predetermined pattern can be formed on the stage by a patterning process.

Figure 13:
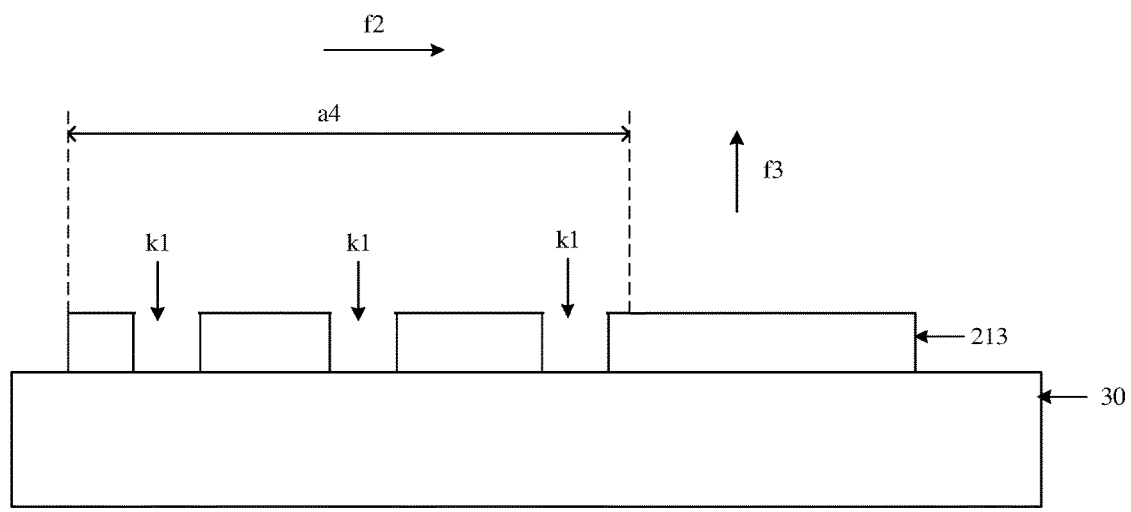
FIG. 13 is a schematic structural diagram of a predetermined pattern on a stage in the embodiment illustrated in FIG. 12.

At the end of step 901, the structure of the predetermined pattern on the stage can be as illustrated in FIG. 13. The stage 30 is provided with the predetermined pattern 213, and the opening region a4 of the predetermined pattern 213 is provided with a plurality of openings k1. The plurality of openings k1 can have a width of 5 to 100 μm in a direction f2 parallel to the stage 30 and a depth of 5 to 50 μm in a direction f3 perpendicular to the stage 30.

Step 902: coating a solution for forming film on the stage provided with the predetermined pattern by a coating technique, to form a coating layer and filling structures flowing into the plurality of openings.

After the solution for forming film is coated on the predetermined pattern, it will flow under the action of gravity and flow into the plurality of openings of the predetermined pattern to form the filling structures in the plurality of openings, and the plurality of voids are present in the filling structures of the plurality of openings.

Figure 14:
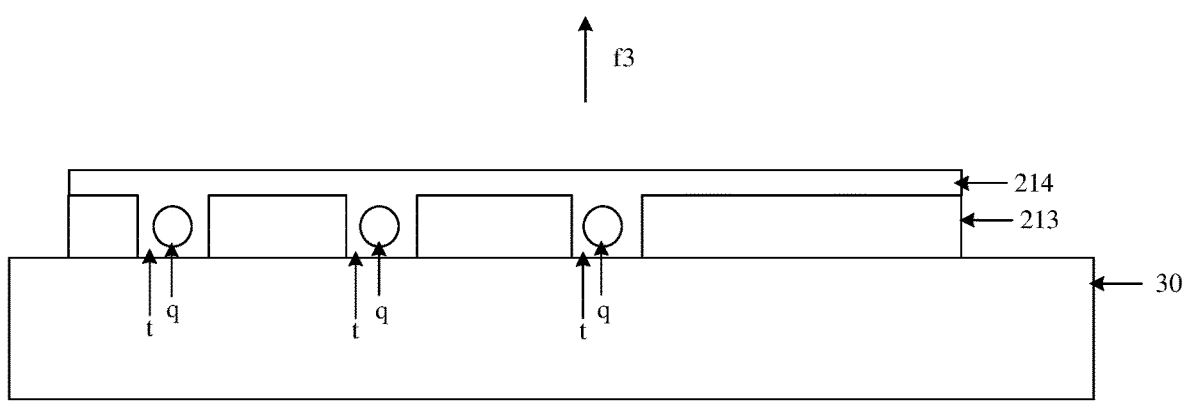
FIG. 14 is another schematic structural diagram of a predetermined pattern on a stage in the embodiment illustrated in FIG. 12.

At the end of step 902, the structure of the predetermined pattern on the stage can be as illustrated in FIG. 14. The coating layer 214 is formed on the predetermined pattern 213, the filling structures are provided in the openings of the predetermined pattern 213, and the voids q are present in the filling structures t. For example, due to the flow rate of the solution for forming film and the solidification rate thereof, there may be a case where a part of filling structures t are not provided with a void q, or a part of the openings are not provided with a filling structure, and these cases are not limitative in the embodiments of the present disclosure. The voids q have a length of 1 to 10 μm in the direction f3 perpendicular to the stage 30.

Step 903: curing the coating layer and the filling structures of the plurality of openings.

The coating layer and the filling structures of the plurality of openings can be cured by standing or heating, and the predetermined pattern together with the coating layer and the filling structures after the curing forms the deformable substrate. The deformable substrate can have a Young's modulus between 0.5 GPa (billion Pascal) and 10 GPa.

Step 904: forming an electronic element on the second region of the deformable substrate.

The present step can be referred to step 803 in the embodiment illustrated in FIG. 8, and details are not described herein again.

Step 905: removing the deformable substrate provided with the formed electronic element from the stage.

Step 906: disposing the deformable substrate provided with the formed electronic element on a flexible base substrate, a side of the deformable substrate not provided with the electronic element being in contact with the flexible base substrate.

The flexible base substrate can have a Young's modulus between 0.1 GPa and 1 GPa.

The present step can be referred to step 805 in the embodiment illustrated in FIG. 8, and details are not described herein again.

The manufacturing method of the array substrate provided by the embodiments of the present disclosure, by forming the electronic element on the deformable substrate having a plurality of voids, enable that the deformable substrate having the plurality of voids has a certain stretchable property and the normal arrangement of the thin film transistor and the wire are not affected. The problem that the array substrate can be provided with only a small number of devices, resulting from that the region on the base substrate in which the strip-shaped through holes are provided cannot be provided with various devices including electronic elements and wires, is solved in the related art. The effect that a large number of various devices can be disposed on the array substrate is achieved.

Figure 15:
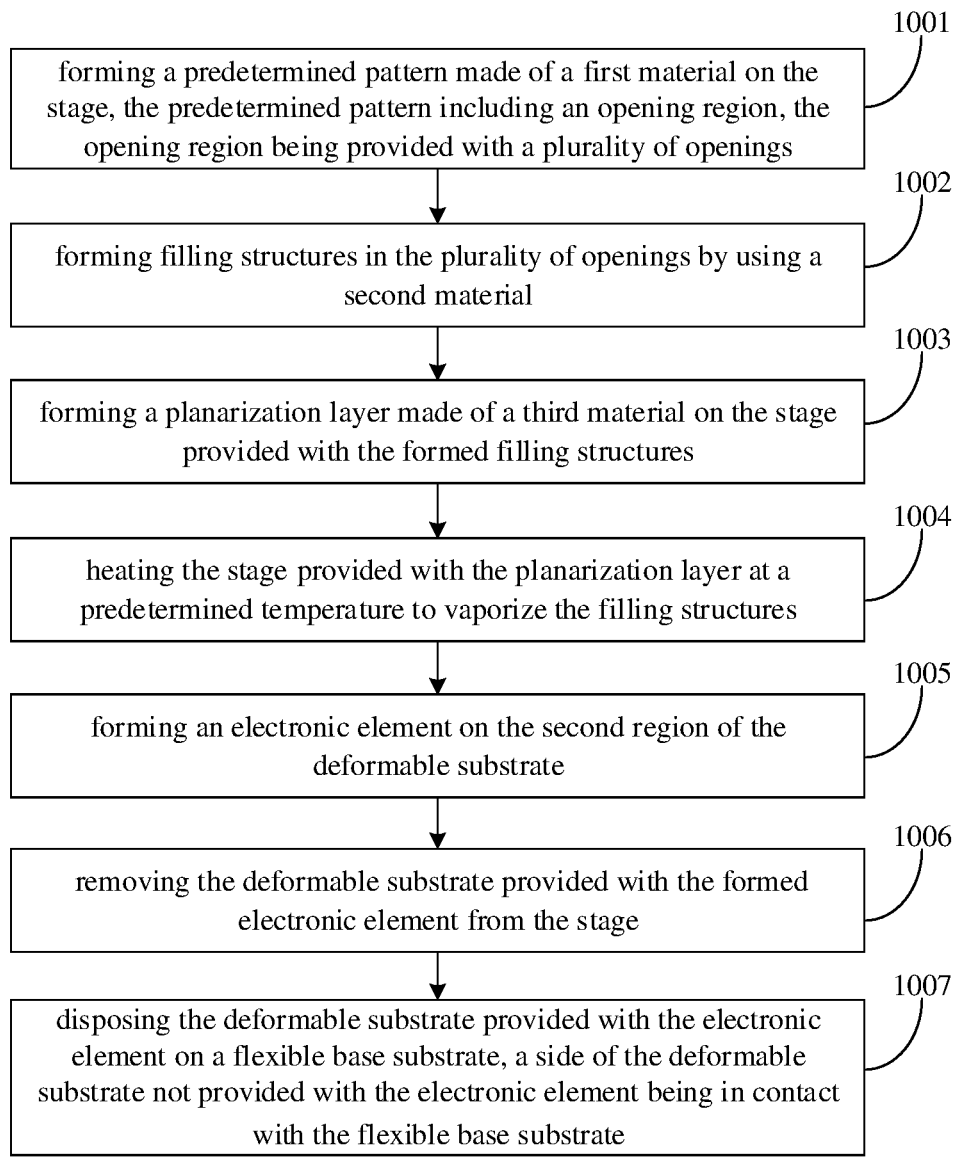
FIG. 15 is a flowchart of a manufacturing method of an array substrate according to another embodiment of the present disclosure.

FIG. 15 is a flowchart of a manufacturing method of an array substrate according to another embodiment of the present disclosure. The method can be used to manufacture the array substrate provided in the embodiment illustrated in FIG. 3, and the method can include the following steps:

Step 1001: forming a predetermined pattern made of a first material on the stage, the predetermined pattern including an opening region, the opening region being provided with a plurality of openings.

The manner for forming the predetermined pattern in the present step can be referred to step 901 in the embodiment illustrated in FIG. 9, and details are not described herein again.

Optionally, the first material used to form the predetermined pattern can include polyimide (PI), a metal material or glass (such as glass fiber), etc.

Step 1002: forming filling structures in the plurality of openings by using a second material.

The filling structure can be formed in the plurality of openings with the second material by a patterning process. For example, a boiling point of the second material is less than a melting point of the first material.

Optionally, the second material can include polycarbonate (PC), polystyrene (PS), or polymethyl methacrylate (PMMA), and the like, all of which having a low melting point.

Figure 16:
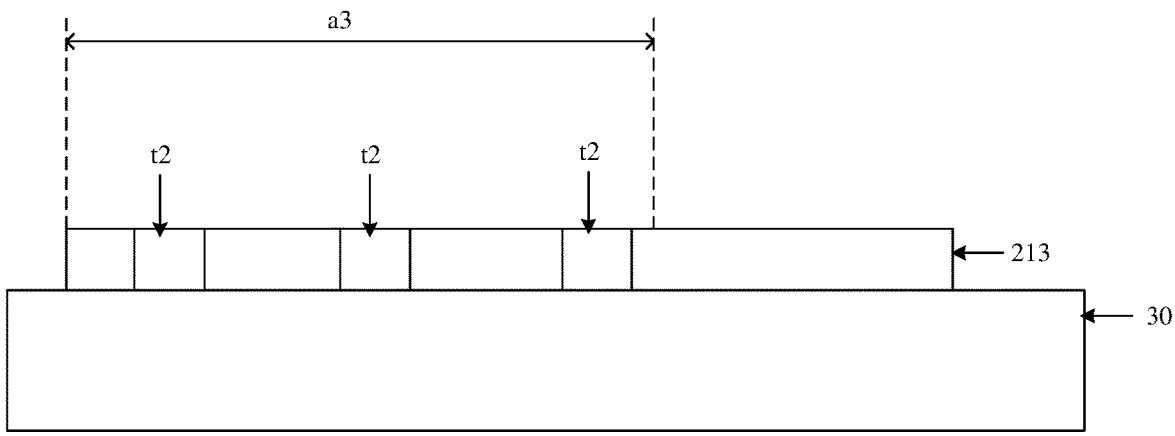
FIG. 16 is a schematic structural diagram of a predetermined pattern on a stage in the embodiment illustrated in FIG. 15.

At the end of step 1002, the structure of the predetermined pattern on the stage can be as illustrated in FIG. 16. The predetermined pattern 213 is formed on the base 30, and filling structures t2 are provided in the openings of the opening region a4 of the predetermined pattern 213.

Step 1003: forming a planarization layer made of a third material on the stage provided with the formed filling structures.

For example, the boiling point of the second material is less than a melting point of the third material. The third material can include polyimide, a metal material, or glass, and the like. The third material and the first material can be a same material, or can be different materials, and these cases are not limitative in the embodiments of the present disclosure.

Figure 17:
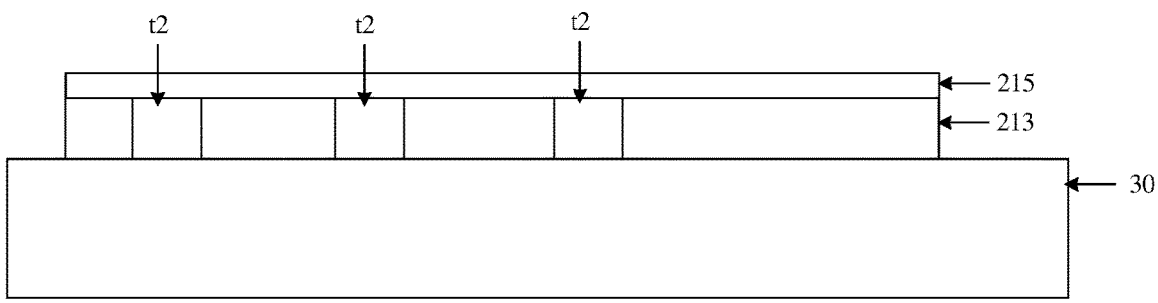
FIG. 17 is a schematic structural diagram of a predetermined pattern and a planarization layer on a stage in the embodiment illustrated in FIG. 15.

At the end of step 1003, the structure on the stage can be as illustrated in FIG. 17. The planarization layer 215 is formed on the predetermined pattern 213 and the filling structures t2.

Because the filling structures fills in the openings of the predetermined pattern, the predetermined pattern has a high flatness, and the formed planarization layer also has a high flatness, which facilitates the formation of subsequent structures (such as TFTs and wires).

Step 1004: heating the stage provided with the planarization layer at a predetermined temperature to vaporize the filling structures.

After the filling structures are vaporized, the space originally occupied by the filling structures will form voids.

The predetermined temperature is greater than the boiling point of the second material, and less than the melting points of the first material and the third material. Therefore, on the basis of vaporizing the filling material, no damage is caused to the predetermined pattern made of the first material and the planarization layer made of the third material.

In addition, the vaporization degree of the filling structures can be controlled by controlling a heating time, that is, the filling structures can be completely vaporized, or the filling structures can be partially vaporized.

Figure 18:
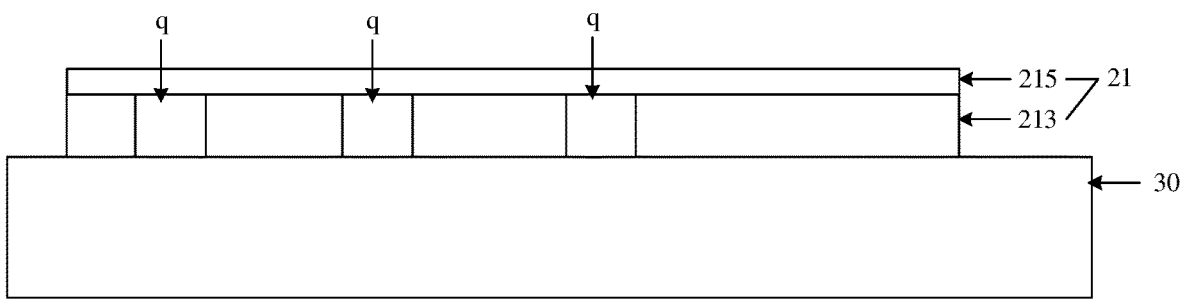
FIG. 18 is another schematic structural diagram of a predetermined pattern and a planarization layer on a stage in the embodiment illustrated in FIG. 15.

At the end of step 1004, the structure of the stage provided with the planarization layer can be as illustrated in FIG. 18. The planarization layer 215 and the predetermined pattern 213 forms the deformable substrate 21. And the deformable substrate 21 is provided with the voids q.

Step 1005: forming an electronic element on the second region of the deformable substrate.

The present step can be referred to step 803 in the embodiment illustrated in FIG. 8, and details are not described herein again.

Step 1006: removing the deformable substrate provided with the formed electronic element from the stage.

Step 1007: disposing the deformable substrate provided with the formed electronic element on a flexible base substrate, a side of the deformable substrate not provided with the electronic element being in contact with the flexible base substrate.

The present step can be referred to step 805 in the embodiment illustrated in FIG. 8, and details are not described herein again.

The manufacturing method of the array substrate provided by the embodiments of the present disclosure, by forming the electronic element on the deformable substrate having a plurality of voids, enable that the deformable substrate having the plurality of voids has a certain stretchable property and the normal arrangement of the thin film transistor and the wire are not affected. The problem that the array substrate can be provided with only a small number of devices, resulting from that the region on the base substrate in which the strip-shaped through holes are provided cannot be provided with various devices including electronic elements and wires, is solved in the related art. The effect that a large number of various devices can be disposed on the array substrate is achieved.

In addition, the embodiments of the present disclosure further provide a display panel, which includes the array substrate provided by the various embodiments described above.

Optionally, the display panel is an organic light emitting diode display panel. The organic light emitting diode display panel is a self-luminous display panel that can be manufactured as a display panel having a certain flexibility.

It should be noted that, in the accompanying drawings, the dimension of a layer or a region may be exaggerated for the purpose of clarity. And it should be understood that, in a case in which an element or a layer is referred to be "on" another element or layer, it may be directly on the another element, or an intermediate layer is interposed therebetween. In addition, it should be understood that, in a case in which an element or a layer is referred to be "under" another element or layer, it may be directly under the another element, or one or more layers or elements are interposed therebetween. In addition, it should also be understood that, in a case in which a layer or an element is referred to be "between" two layers or two elements, it can be an only layer between the two layers or the two elements, or more than one layer or element is interposed therebetween. Like reference numerals indicate like elements throughout.

In the present disclosure, the terms "first," "second," and "third," are used for descriptive purposes only and are not to be construed as indicating or implying relative importance. The term "plurality of" refers to two or more than two, unless otherwise defined.

The foregoing are merely exemplary embodiments of the invention, but is not used to limit the protection scope of the invention. The protection scope of the invention shall be defined by the attached claims.

What is claimed is:

1. An array substrate, comprising: a deformable substrate, the deformable substrate comprising a first region and a second region, the first region being provided with a plurality of voids, and the second region being a region of the deformable substrate not provided with the plurality of voids; an electronic element on the second region of the deformable substrate; and
further comprising a flexible base substrate, the deformable substrate is located on the flexible base substrate, the deformable substrate is located on the flexible base substrate, and a side of the deformable substrate not provided with the electronic element is in contact with the flexible base substrate.

2. The array substrate according to claim 1, wherein the plurality of voids are separated from a surface of a side of the deformable substrate where the electronic element is formed.

3. The array substrate according to claim 1, wherein the plurality of voids are cavities.

4. The array substrate according to claim 1, wherein the plurality of voids are grooves,
the grooves are on a side of the deformable substrate opposite to the electronic element.

5. The array substrate according to claim 1, wherein the deformable substrate is made of an organic material.

6. The array substrate according to claim 1, further comprising a wire,
the wire is on the deformable substrate, and the wire is a curved wire.

7. The array substrate according to claim 6, wherein the wire and the electronic element are on a same side of the deformable substrate, and the wire is at least partially located in the first region.

8. The array substrate according to claim 7, wherein the plurality of voids are evenly distributed in the first region of the deformable substrate.

9. A manufacturing method of an array substrate, comprising: forming a deformable substrate, the deformable substrate comprising a first region and a second region, the first region being provided with a plurality of voids, and the second region being a region of the deformable substrate not provided with the plurality of voids; forming an electronic element on the second region of the deformable substrate; and disposing the deformable substrate provided with the electronic element on a flexible base substrate.

10. The method according to claim 9, wherein the plurality of voids are separated from a surface of a side of the deformable substrate where the electronic element is formed.

11. The method according to claim 9, further comprising: forming a wire, wherein the wire and the electronic element are on a same side of the deformable substrate, and the wire is at least partially located in the first region.

12. The method according to claim 9, wherein forming the deformable substrate comprises:
forming the deformable substrate on a stage;
after forming the electronic element on the second region of the deformable substrate, the method further comprises:
removing the deformable substrate provided with the electronic element from the stage.

13. The method according to claim 12, wherein, after removing the deformable substrate on which the electronic element is formed from the stage, the method further comprises: a side of the deformable substrate not provided with the electronic element being in contact with the flexible base substrate.

14. The method according to claim 12, wherein the deformable substrate comprises a deformable layer provided with the plurality of voids and a planarization layer on the deformable layer, forming the deformable substrate on the stage comprises:

forming the deformable layer on the stage; and forming the planarization layer on the stage provided with the deformable layer.

15. The method according to claim 12, wherein forming the deformable substrate on the stage comprises:

forming a predetermined pattern on the stage, the predetermined pattern comprising an opening region, the opening region being provided with a plurality of openings;

coating a solution for forming film on the stage provided with the predetermined pattern to form a coating layer and filling structures flowing into the plurality of openings, the plurality of voids being present in the filling structures of the plurality of openings; and curing the coating layer and the filling structures of the plurality of openings, the predetermined pattern together with the coating layer and the filling structures after curing forming the deformable substrate.

16. The method according to claim 12, wherein forming the deformable substrate on the stage comprises:

forming a predetermined pattern made of a first material on the stage, the predetermined pattern comprising an opening region, the opening region being provided with a plurality of openings;

forming filling structures in the plurality of openings by using a second material, a boiling point of the second material being less than a melting point of the first material;

forming a planarization layer made of a third material on the stage provided with the filling structures, the boiling point of the second material being less than a melting point of the third material; and heating the stage provided with the planarization layer at a predetermined temperature to vaporize the filling structures, the predetermined temperature being greater than the boiling point of the second material, and less than the melting points of the first material and the third material.

17. The method according to claim 9, wherein the first region and the second region are predetermined before forming the plurality of voids of the deformable substrate, the second region is a region required for forming the electronic element, the first region is a region other than the region required for forming the electronic element.

18. A display panel, comprising the array substrate according to claim 1.

19. The display panel according claim 18, wherein the display panel is an organic light emitting diode display panel.

* * * * *